United States Patent
Pandey et al.

(10) Patent No.: US 9,319,057 B1
(45) Date of Patent: Apr. 19, 2016

(54) DEVICE AND METHOD FOR PROVIDING FILTERING FOR AN ANALOG-TO-DIGITAL CONVERTER (ADC)

(71) Applicant: NXP B.V., Eindhoven (NL)

(72) Inventors: Sujan Pandey, Eindhoven (NL); Hubertus Gerardus Hendrikus Vermeulen, Eindhoven (NL); Abhijit Kumar Deb, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/663,162

(22) Filed: Mar. 19, 2015

(51) Int. Cl.
*H03M 1/06* (2006.01)
*H03M 1/00* (2006.01)
*H03M 1/12* (2006.01)

(52) U.S. Cl.
CPC ............ *H03M 1/0626* (2013.01); *H03M 1/002* (2013.01); *H03M 1/12* (2013.01)

(58) Field of Classification Search
CPC ...... H03M 1/12; H03M 1/002; H03M 1/0626
USPC ............. 341/143, 125, 166, 163, 67, 50, 118; 375/219, 232, 345
See application file for complete search history.

(56) References Cited

U.S. PATENT DOCUMENTS

| | | | | |
|---|---|---|---|---|
| 4,633,225 A * | 12/1986 | Hayashi | ................. | H03H 17/00 341/163 |
| 5,227,795 A * | 7/1993 | Yamakido | ............. | H03M 3/434 341/143 |
| 5,559,722 A * | 9/1996 | Nickerson | ................. | H04N 7/15 341/50 |
| 5,638,068 A * | 6/1997 | Nickerson | ............. | G06F 17/147 341/67 |
| 6,975,674 B1 * | 12/2005 | Phanse | ............... | H04L 25/02019 375/219 |
| 2003/0215100 A1 * | 11/2003 | Kimura | ................... | G01G 3/147 381/71.1 |
| 2004/0027262 A1 * | 2/2004 | Cloetens | .......... | G11B 20/10009 341/123 |
| 2009/0085786 A1 * | 4/2009 | Hatae | .................... | H03M 3/442 341/143 |

\* cited by examiner

*Primary Examiner* — Lam T Mai
(74) *Attorney, Agent, or Firm* — Rajeev Madnawat

(57) ABSTRACT

Devices and methods for providing filtering for an analog-to-digital converter (ADC) are described. In one embodiment, a method for providing filtering for an ADC involves obtaining a filter coefficient of a post-filtering filter that is located after the ADC on a signal path and generating a filter coefficient of a pre-filtering filter that is located before the ADC on the signal path based on the filter coefficient of the post-filtering filter. Other embodiments are also described.

20 Claims, 4 Drawing Sheets

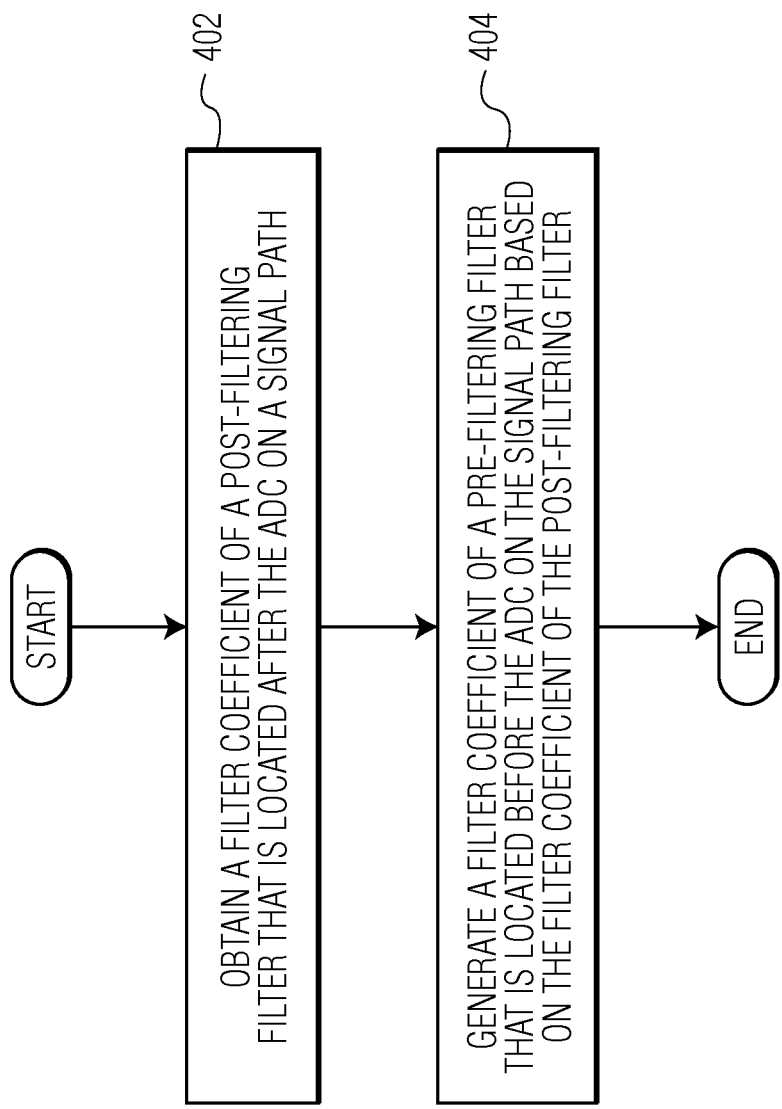

DEVICE AND METHOD FOR PROVIDING FILTERING FOR AN ANALOG-TO-DIGITAL CONVERTER (ADC)

Embodiments of the invention relate generally to electronic systems and methods and, more particularly, to systems and methods for operating filters.

In a communications system, an analog-to-digital converter (ADC) based architecture can be used to reduce the total cancellation of intersymbol interference (ISI) and echo presence in received signals. Signal quality of received signals can be improved by increasing ADC dynamic range and resolution. However, increasing dynamic range and resolution in an ADC can result in increment in substrate area and power consumption of an Integrated Circuit (IC) chip. For example, every extra bit requirement in a high speed ADC can roughly double the silicon area and power consumption of an IC chip.

Typically, filters can be used in the signal path before and/or after an ADC to improve the signal-to-noise ratio (SNR), which reduces the ADC resolution requirement. For example, filters, such as a non-adaptive analog high pass filter or an adaptive analog equalizer, can be placed in the signal path before an ADC. However, a non-adaptive analog high pass filter generally does not cope well with a communications channel that varies over time. An analog adaptive filter with an independent adaptive algorithm can work with the time varying channel. However, an analog adaptive filter with an independent adaptive algorithm typically has a maximum of 2 taps because of design complexity and reduction in algorithm accuracy associated with a high number of taps.

Devices and methods for providing filtering for an ADC are described. In one embodiment, a method for providing filtering for an ADC involves obtaining a filter coefficient of a post-filtering filter that is located after the ADC on a signal path and generating a filter coefficient of a pre-filtering filter that is located before the ADC on the signal path based on the filter coefficient of the post-filtering filter. Other embodiments are also described.

In one embodiment, a device for providing filtering for an ADC includes a monitoring module configured to obtain a filter coefficient of a post-filtering filter that is located after the ADC on a signal path and a filter coefficient generation module configured to generate a filter coefficient of a pre-filtering filter that is located before the ADC on the signal path based on the filter coefficient of the post-filtering filter.

In one embodiment, a method for providing filtering for an ADC involves obtaining a filter coefficient of a post-filtering filter that is located after the ADC on a signal path by adjusting the filter coefficient of the post-filtering filter iteratively according to a least mean square (LMS) algorithm and generating a filter coefficient of a pre-filtering filter that is located before the ADC on the signal path based on the filter coefficient of the post-filtering filter by linearly converting an amplitude of the filter coefficient of the post-filtering filter into an amplitude of the filter coefficient of the pre-filtering filter.

Other aspects and advantages of embodiments of the present invention will become apparent from the following detailed description, taken in conjunction with the accompanying drawings, depicted by way of example of the principles of the invention.

FIG. 4 is a process flow diagram of a method for providing filtering for an ADC in accordance with an embodiment of the invention.

Throughout the description, similar reference numbers may be used to identify similar elements.

It will be readily understood that the components of the embodiments as generally described herein and illustrated in the appended figures could be arranged and designed in a wide variety of different configurations. Thus, the following detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment. Rather, language referring to the features and advantages is understood to mean that a specific feature, advantage, or characteristic described in connection with an embodiment is included in at least one embodiment. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment," "an embodiment," or similar language means that a particular feature, structure, or characteristic described in connection with the indicated embodiment is included in at least one embodiment. Thus, the phrases "in one embodiment," "in an embodiment," and similar language throughout this specification may, but do not necessarily, all refer to the same embodiment.

Figure 1:
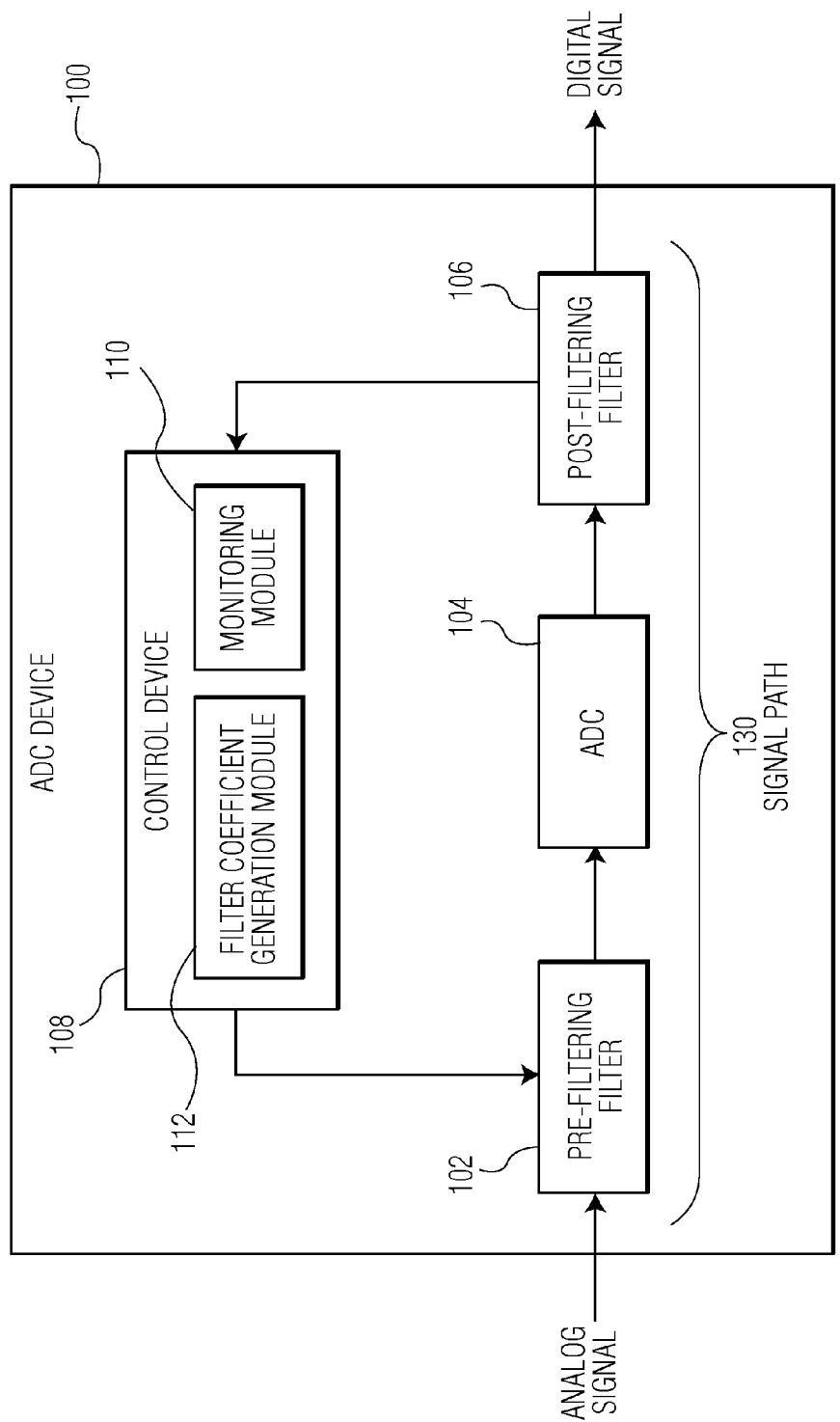
FIG. 1 is a schematic block diagram of an ADC device in accordance with an embodiment of the invention.

FIG. 1 is a schematic block diagram of an ADC device 100 in accordance with an embodiment of the invention. The ADC device can be used for various applications. In an embodiment, the ADC device is a part of a communication network that is used for an automotive application. For example, the communication network facilitates communication among communication devices, such as electronic controller nodes in an automobile system, which may be located within a single vehicle or distributed across multiple vehicles. The communication network may be an in-vehicle network (IVN), for example, a Local Interconnect Network (LIN), a Controller Area Network (CAN) or a FlexRay™ compatible network. The ADC device can be embodied in various physical forms. For example, the ADC device may be implemented as an Integrated Circuit (IC) chip. In an embodiment, the ADC device is a physical layer (PHY) chip, such as an Ethernet PHY chip, which may be a part of an automotive device.

In the embodiment depicted in FIG. 1, the ADC device 100 includes a pre-filtering filter 102, an ADC 104, a post-filtering filter 106, and a control device 108. Although the ADC device is shown in FIG. 1 as being including one pre-filtering filter, in some embodiments, the ADC device includes multiple pre-filtering filters. In addition, although the ADC device is shown in FIG. 1 as including one post-filtering filter, in some embodiments, the ADC device includes multiple post-filtering filters.

The pre-filtering filter 102 of the ADC device 100 is located on the signal path 130 before the ADC 104. The pre-filtering filter can be used to improve the SNR, which reduces the ADC resolution requirement. The pre-filtering filter can be any suitable type of analog filter. In some embodiments, the pre-filtering filter is an analog finite impulse response (FIR) filter whose impulse response is of finite duration.

The ADC 104 of the ADC device 100 is configured to convert an analog signal from the pre-filtering filter 102 into a digital signal that is transmitted to the post-filtering filter 106. For example, the ADC can convert an analog signal with certain amplitude and phase into a digital signal with a corresponding number of bits.

The post-filtering filter 106 of the ADC device 100 is located on the signal path 130 after the ADC 104. The post-filtering filter can be any suitable type of digital filter. In some embodiments, the post-filtering filter is a digital FIR filter whose impulse response is of finite duration. For a digital filter, such as a FIR filter, the output signal of the digital filter is a weighted sum of the current and previous values of an input signal to the digital filter, which include a signal sample and one or more delayed versions of the signal sample. The current and previous values of the input signal to the digital filter are referred to as the taps of the digital filter. In other words, taps of a digital filter are variations (undelayed/delayed) of the input signal of the digital filter that are included in the output signal of the digital filter. For example, the output signal, y[n], and the input signal, d[n], of a discrete time FIR filter may satisfy:

$$y[n] = \sum_{i=0}^{N} C_i \times d[n-i], \quad (1)$$

where $C_i$ represents filter coefficients, N represents the filter order, d[n−1] represents filter taps, and N is a positive integer. Herein, n represents the signal index of a discrete signal, which is a non-negative integer.

The control device 108 of the ADC device 100 is configured to generate a filter coefficient of the pre-filtering filter 102 based on a filter coefficient of the post-filtering filter 106. Consequently, the filter coefficient of the post-filtering filter can be re-used for generating the filter coefficient of the pre-filtering filter. By reusing the filter coefficient of the post-filtering filter to generate the filter coefficient of the pre-filtering filter, the complexity of the pre-filtering filter can be reduced while the requirements for the pre-filtering filter in terms of coefficient accuracy and the number of taps can be satisfied. For example, compared to a typical pre-filtering filter that has a maximum of 2 taps because of design complexity and the accuracy of adaptive algorithm associated with a high number of filter taps, the pre-filtering filter depicted in FIG. 1 can have more than two taps. In addition, instead of having a separate adaptive algorithm for a pre-filter with number of taps that is more than two, reusing the filter coefficient of the adaptive post-filtering filter can allow the accuracy of the adaptive algorithm of the pre-filtering filter to be close to the accuracy of the adaptive algorithm of the post-filtering adaptive filter and reduce the area overheard of the pre-filtering filter.

In the embodiment depicted in FIG. 1, the control device 108 includes a monitoring module 110 configured to obtain the filter coefficient of the post-filtering filter 106 and a filter coefficient generation module 112 configured to generate a filter coefficient of the pre-filtering filter 102 based on the filter coefficient of the post-filtering filter. In some embodiments, the control device is configured to monitor, manipulate and/or control of the filter coefficient of the pre-filtering filter or the post-filtering filter. For example, the control device is configured to linearly convert the filter coefficient amplitude of the post-filtering filter into the required filter coefficient amplitude of the pre-filtering filter, which is set to be lower than a predefined amplitude threshold. In another example, the control device is configured to vary the filter coefficient amplitude of the pre-filtering filter depending on the timing or a mode of operation of the pre-filtering filter. In one embodiment, the control device is configured to evaluate the filter coefficient amplitude of the pre-filtering filter after monitoring parameters such as amplitude and timing. The filter coefficient amplitude of the pre-filtering filter may be identical to the filter coefficient amplitude of the post-filtering filter. Alternatively, the filter coefficient amplitude of the pre-filtering filter is different from the filter coefficient amplitude of the post-filtering filter.

In an example operation of the ADC device 100, an input analog signal is inputted into the pre-filtering filter 102 in which the input analog signal is filtered into a filtered analog signal. The filtered analog signal is inputted into the ADC 104 in which the filtered analog signal is converted into a digital signal. The digital signal is inputted into the post-filtering filter 106 in which the digital signal is filtered into a filtered digital signal. The control device 108 obtains the filter coefficient of the post-filtering filter and sets the filter coefficient for the pre-filtering filter based on the filter coefficient of the post-filtering filter.

Figure 2:
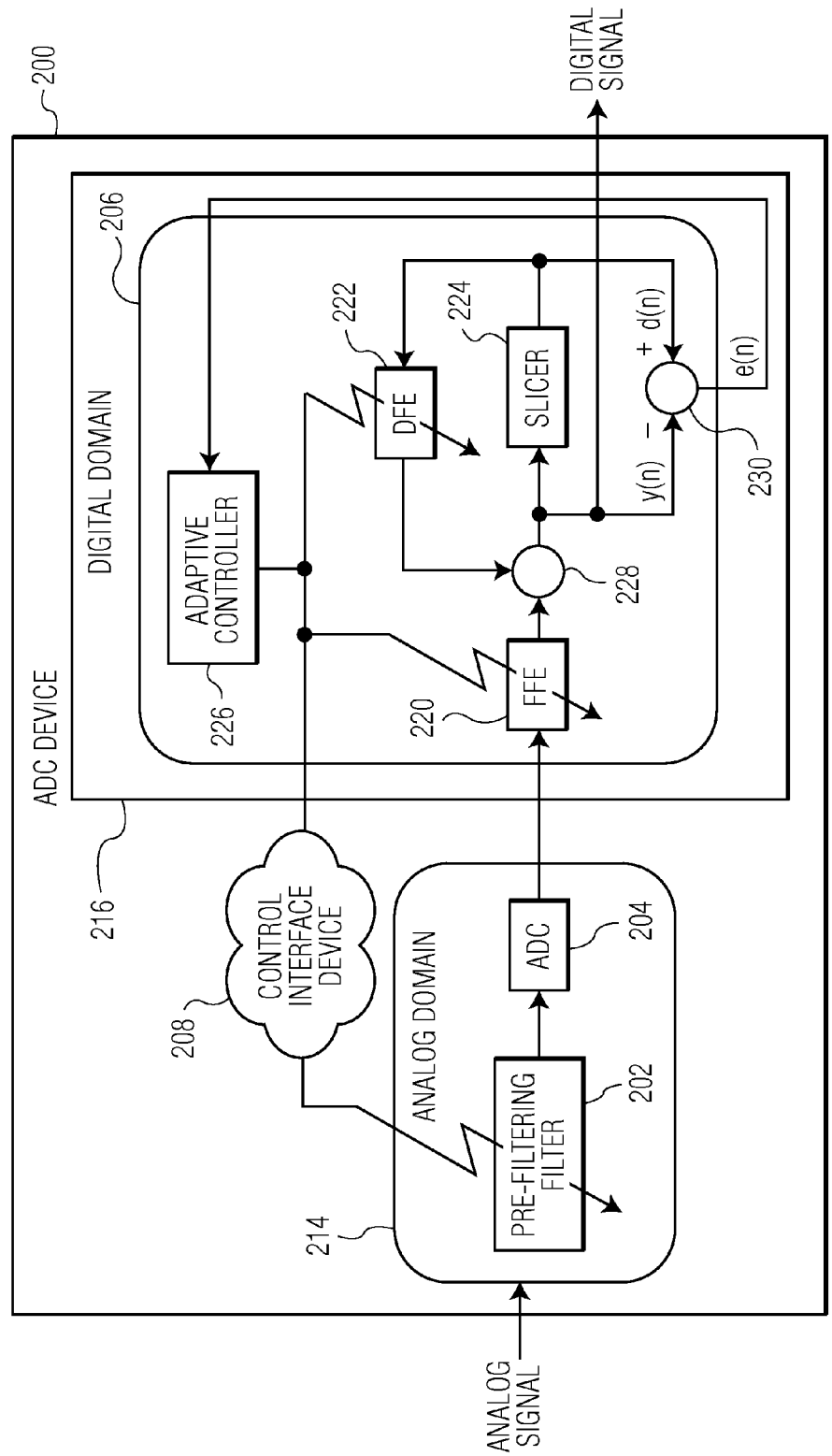
FIG. 2 depicts a first embodiment of the ADC device depicted in FIG. 1.
Figure 3:
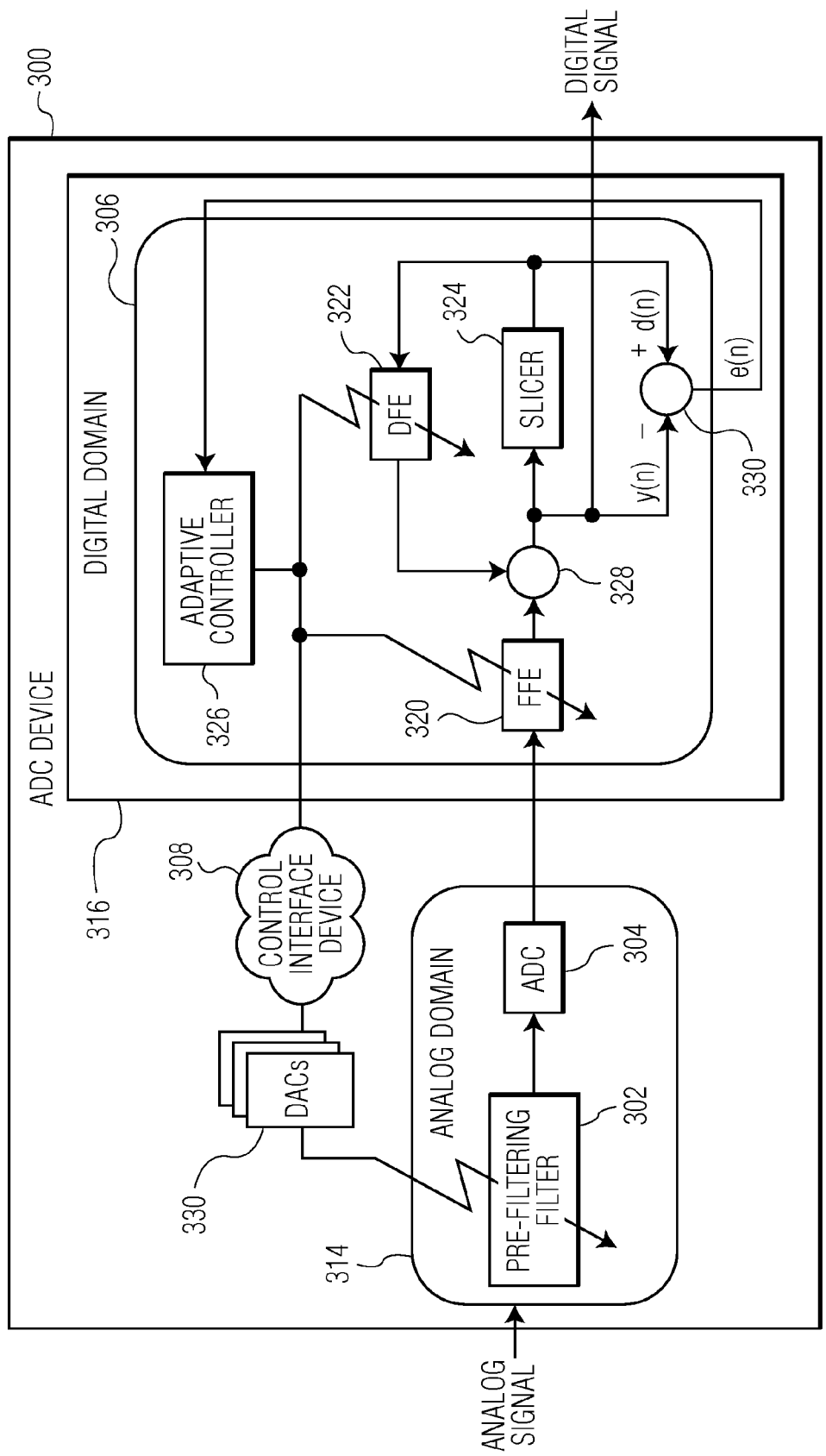
FIG. 3 depicts a second embodiment of the ADC device depicted in FIG. 1.

FIGS. 2 and 3 depict two embodiments of the ADC device 100 depicted in FIG. 1. ADC devices 200, 300 depicted in FIGS. 2 and 3 are merely two of the possible implementations of the ADC device 100 depicted in FIG. 1. However, the ADC device 100 depicted in FIG. 1 can be implemented differently from the ADC devices 200, 300 depicted in FIGS. 2 and 3. The invention is not restricted to the particular implementation of the devices depicted in FIGS. 2 and 3.

FIG. 2 depicts a first embodiment of the ADC device 100 depicted in FIG. 1. In the embodiment depicted in FIG. 2, the ADC device 200 includes an analog pre-filtering filter 202, an ADC 204, a digital post-filtering filter 206, and a control interface device 208. The pre-filtering filter and the ADC are analog devices while the post-filtering filter and the control interface device are digital devices.

In the embodiment depicted in FIG. 2, the post-filtering filter 206 is located in digital domain 216 while the pre-filtering filter and the ADC 204 are located in analog domain 214. Consequently, the filter coefficient of the analog pre-filtering filter 202 is computed in digital domain and an existing adaptive filter algorithm used by the digital post-filtering filter, such as a least mean square (LMS) algorithm or a recursive least square (RLS) algorithm, can be used to update the filter coefficient of the analog pre-filtering filter through the control interface device 208. By reusing the filter coefficient of the digital post-filtering filter to generate the filter coefficient of the analog pre-filtering filter, the complexity of the analog pre-filtering filter can be reduced while the requirements for the analog pre-filtering filter in terms of coefficient accuracy and the number of taps can be satisfied. In addition, ADC bits can be reduced significantly by improving the SNR in the signal path before ADC. For example, without a partial adaptive pre-filtering filter, an 8-bit ADC is required while with a partial adaptive pre-filtering filter, a 5-bit ADC can be used to replace the 8-bit ADC. Further, the number of feed forward equalizer (FFE) and decision feedback equalizer (DFE) taps can be reduced, e.g., by a factor of 2, and ISI removal and echo cancellation can be improved. Compared to a typical ADC device, the ADC device 200 can reduce power consumption and the complexity of signal processing blocks.

The analog pre-filtering filter 202 of the ADC device 200 is located on the signal path before the ADC 204. In some embodiments, the pre-filtering filter is an analog FIR filter whose impulse response is of finite duration. In the embodiment depicted in FIG. 2, the pre-filtering filter is used to provide partial equalization. In some embodiments, the pre-filtering filter may be used for echo cancellation.

The ADC 204 of the ADC device 200 is configured to convert an analog signal from the analog pre-filtering filter 202 into a digital signal that is transmitted to the post-filtering filter 206.

The digital post-filtering filter 206 of the ADC device 200 is located on the signal path after the ADC 204. In some embodiments, the post-filtering filter may be a digital FIR filter whose impulse response is of finite duration. In the embodiment depicted in FIG. 2, the post-filtering filter includes a feed forward equalizer (FFE) 220, a decision feedback equalizer (DFE) 222, a slicer 224, an adaptive controller 226 and two adders 228, 230. In an embodiment, the post-filtering filter is an adaptive filter that adjusts the coefficients of the post-filtering filter iteratively to minimize the error signal, "e(n)," of the post-filtering filter.

The FFE 220 of the digital post-filtering filter 206 is configured to correct a received waveform with information about the waveform itself and not information about the logical decisions made on the waveform. In some embodiments, the FFE uses the voltage levels of a received waveform associated with previous and current bits to correct the voltage level of a current bit.

The DFE 222 of the digital post-filtering filter 206 is configured to calculate a correction value that is added to the logical decision threshold. The DFE allows new logical decisions to be made on the signal waveform based upon a new threshold level.

The slicer 224 of the digital post-filtering filter 206 is configured to process the combination signal from the FFE and the DFE and to generate a signal for the DFE.

The adaptive controller 226 of the digital post-filtering filter 206 is configured to control the FFE and the DFE based on the error signal, "e(n)." In some embodiments, the adaptive controller is configured to control the FFE and the DFE to minimize the error signal. The adaptive controller adjusts the filter coefficients according to an adaptive algorithm. In some embodiments, the adaptive controller adjusts the filter coefficients iteratively according to a distance-based algorithm, such as a least mean square (LMS) algorithm or a recursive least square (RLS) algorithm.

In one embodiment, the adaptive controller 226 adjusts the filter coefficients iteratively according to the LMS algorithm. For example, the adaptive controller calculates an error signal e(n) as:

$$e(n)=d(n)-y(n), \qquad (2)$$

where y(n) represents an output signal from the adder 228, d(n) represents an output signal from the slicer 224, and n is a positive integer. The output signal y(n) can be represented as:

$$y(n)=X(n).C_{FFE}(n)-D(n).C_{DFE}(n), \qquad (3)$$

where $C_{FFE}(n)$ represents the filter coefficients of the FFE 220 and $C_{DFE}(n)$ represents the filter coefficients of the DFE 222. The adaptive controller updates the FFE filter coefficients by using the following equation:

$$_{FFE}(n+1)=C_{FFE}(n)+u.e(n).X(n), \qquad (4)$$

Similarly, the adaptive controller updates the DFE filter coefficients by using the follow equation:

$$_{DFE}(n+1)=C_{DFE}(n)+u.e(n).D(n), \qquad (5)$$

where η represents the step size of the adaptive filter, C(n) represents the filter coefficients vector D(n) represents the slicer output vector, and X(n) represents the filter (FFE) input vector. However, in another embodiment, Eqs. (4) and (5) can be derived as a function of an ideal integrator or a non-ideal integrator.

The control interface device 208 of the ADC device 200 is configured to monitor or manipulate the filter coefficient of the post-filtering filter 206 and to control the filter coefficient of the pre-filtering filter 202 based on the filter coefficient of the post-filtering filter. In some embodiments, the control interface device is configured to monitor, manipulate and/or control of the filter coefficient of the pre-filtering filter or the post-filtering filter. In one embodiment, the control interface device is configured to linearly convert the filter coefficient amplitude of the post-filtering filter into the required filter coefficient amplitude of the pre-filtering filter, which is set to be lower than a predefined amplitude threshold. In one embodiment, the control interface device is configured to vary the filter coefficient amplitude of the pre-filtering filter depending on timing or mode of operation. In one embodiment, the control interface device is configured to evaluate the filter coefficient amplitude of the pre-filtering filter after monitoring parameters such as amplitude and timing. In some embodiments, the filter coefficient of the pre-filtering filter is identical to the filter coefficient of the post-filtering filter. Alternatively, the filter coefficient of the pre-filtering filter is different from the filter coefficient of the post-filtering filter. In some embodiments, the control interface device includes one or more digital-to-analog converters (DACs), which are used to convert a digital control signal into an analog control signal for setting the filter coefficient of the pre-filtering filter.

In some embodiments, the control interface device 208 does not have capability of converting digital control signals into analog control signals. In these embodiments, one or more DACs are used to convert a digital control signal from the control interface device 208 into an analog control signal for setting the filter coefficient of the pre-filtering filter. FIG. 3 depicts a second embodiment of the ADC device 100 depicted in FIG. 1. In the embodiment depicted in FIG. 3, the ADC device 300 includes an analog pre-filtering filter 302, an ADC 304, the digital post-filtering filter 306, a control interface device 308 and one or more DACs 330. The pre-filtering filter and the ADC are analog devices while the control interface device, the post-filtering filter and the DACs are digital devices. In the embodiment depicted in FIG. 3, the filter coefficient of the analog pre-filtering filter 302 is computed in digital domain 316 while the pre-filtering filter and the ADC 304 are located in analog domain 314.

The analog pre-filtering filter 302, the ADC 304 and the digital post-filtering filter 306 depicted in FIG. 3 may be the same as or similar to the analog pre-filtering filter 202, the ADC 204 and the digital post-filtering filter 206 depicted in FIG. 2, respectively. For example, the analog pre-filtering filter 302 of the ADC device 300 is located on the signal path before the ADC and is used to provide partial equalization. The ADC is configured to convert an analog signal from the analog pre-filtering filter into a digital signal that is transmitted to the post-filtering filter 306. The digital post-filtering filter is located on the signal path after the ADC and includes an FFE 320, a DFE 322, a slicer 324, an adaptive controller 326 and two adders 328, 330.

The FFE 320, the DFE 322, the slicer 324 and the adaptive controller 326 depicted in FIG. 3 may be the same as or similar to the FFE 220, the DFE 222, the slicer 224 and the adaptive controller 226 depicted in FIG. 2, respectively. For example, the FFE of the digital post-filtering filter 306 can be configured to correct a received waveform with information about the waveform itself and not information about the logical decisions made on the waveform. The DFE can be configured to calculate a correction value that is added to the logical decision threshold. The DFE allows new logical decisions to be made on the signal waveform based upon the new equalized threshold level. The slicer can be configured to process the combination signal from the FFE and the DFE and to generate a signal for the DFE. The adaptive controller can be configured to control the FFE and the DFE based on the error signal, "e(n)."

The control interface device 308 of the ADC device 300 is configured to monitor or manipulate the filter coefficient of the post-filtering filter and to control the filter coefficient of the pre-filtering filter based on the filter coefficient of the post-filtering filter. The digital-to-analog converters (DACs) 330 are used to convert a digital control signal into an analog control signal for setting the filter coefficient of the pre-filtering filter.

FIG. 4 is a process flow diagram of a method for providing filtering for an analog-to-digital converter (ADC) in accordance with an embodiment of the invention. At block 402, a filter coefficient of a post-filtering filter that is located after the ADC on a signal path is obtained. At block 404, a filter coefficient of a pre-filtering filter that is located before the ADC on the signal path is generated based on the filter coefficient of the post-filtering filter. The pre-filtering filter may be similar to or same as the pre-filtering filter 102, 202, or 302 depicted in FIG. 1, 2 or 3. The ADC may be similar to or same as the ADC 104, 204, or 304 depicted in FIG. 1, 2 or 3. The post-filtering filter may be similar to or same as the post-filtering filter 106, 206, or 306 depicted in FIG. 1, 2 or 3.

The various components or units of the embodiments that have been described or depicted (e.g., the control device 108, the control interface devices 208, 308, the FFEs 220, 320, the DFEs 222, 322, the slicers 224, 324, and the adaptive controllers 226, 326) may be implemented in hardware, software that is stored in a non-transitory computer readable medium or a combination of hardware and software that is stored in a non-transitory computer readable medium. The non-transitory computer readable medium can be an electronic, magnetic, optical, electromagnetic, infrared, or semiconductor system (or apparatus or device), or a propagation medium. Examples of a non-transitory computer-readable medium include a semiconductor or solid state memory, magnetic tape, a removable computer diskette, a random access memory (RAM), a read-only memory (ROM), a rigid magnetic disk, and an optical disk. Current examples of optical disks include a compact disk with read only memory (CD-ROM), a compact disk with read/write (CD-R/W), a digital video disk (DVD), and a Blu-ray disk. Furthermore, the various components or units of the embodiments (e.g., the control device, the control interface devices, the FFEs, the DFEs, the slicers and the adaptive controllers) that have been described or depicted may be implemented in a processor, which may include a multifunction processor and/or an application-specific processor.

Although the operations of the method herein are shown and described in a particular order, the order of the operations of the method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

In addition, although specific embodiments of the invention that have been described or depicted include several components described or depicted herein, other embodiments of the invention may include fewer or more components to implement less or more feature.

Furthermore, although specific embodiments of the invention have been described and depicted, the invention is not to be limited to the specific forms or arrangements of parts so described and depicted. The scope of the invention is to be defined by the claims appended hereto and their equivalents.

What is claimed is:

1. A method for providing filtering for an analog-to-digital converter (ADC), the method comprising:
   obtaining a filter coefficient of a post-filtering filter that is located after the ADC on a signal path; and
   generating a filter coefficient of a pre-filtering filter that is located before the ADC on the signal path based on the filter coefficient of the post-filtering filter.

2. The method of claim 1, wherein the pre-filtering filter comprises an analog filter.

3. The method of claim 2, wherein the post-filtering filter comprises a digital adaptive filter.

4. The method of claim 3, wherein generating the filter coefficient of the pre-filtering filter comprises linearly converting an amplitude of the filter coefficient of the post-filtering filter into an amplitude of the filter coefficient of the pre-filtering filter.

5. The method of claim 4, wherein the amplitude of the filter coefficient of the pre-filtering filter is lower than a predefined amplitude threshold.

6. The method of claim 4, wherein linearly converting the amplitude of the filter coefficient of the post-filtering filter into the amplitude of the filter coefficient of the pre-filtering filter comprises changing the amplitude of the filter coefficient of the pre-filtering filter depending on a timing or a mode of operation of the pre-filtering filter.

7. The method of claim 3, wherein obtaining the filter coefficient of the post-filtering filter comprises adjusting the filter coefficient of the post-filtering filter iteratively according to a least mean square (LMS) algorithm or a recursive least square (RLS) algorithm.

8. The method of claim 1, wherein obtaining the filter coefficient of the post-filtering filter comprises adjusting the filter coefficient of the post-filtering filter iteratively according to a least mean square (LMS) algorithm.

9. The method of claim 3, wherein generating the filter coefficient of the pre-filtering filter comprises converting a digital control signal into an analog control signal, wherein the digital control signal contains the filter coefficient of the post-filtering filter and wherein the analog control signal contains the filter coefficient of the pre-filtering filter.

10. The method of claim 1, wherein the filter coefficient of the pre-filtering filter is different from the filter coefficient of the post-filtering filter.

11. The method of claim 1, wherein one of the pre-filtering filter and the post-filtering filter is a finite impulse response (FIR) filter.

12. A device for providing filtering for an analog-to-digital converter (ADC), the device comprising:
   a monitoring module configured to obtain a filter coefficient of a post-filtering filter that is located after the ADC on a signal path; and
   a filter coefficient generation module configured to generate a filter coefficient of a pre-filtering filter that is located before the ADC on the signal path based on the filter coefficient of the post-filtering filter.

13. The device of claim 12, wherein the pre-filtering filter comprises an analog filter, and wherein the post-filtering filter comprises a digital adaptive filter.

14. The device of claim 13, wherein the filter coefficient generation module is further configured to convert an amplitude of the filter coefficient of the post-filtering filter into an amplitude of the filter coefficient of the pre-filtering filter.

15. The device of claim 14, wherein the filter coefficient generation module is further configured to change the amplitude of the filter coefficient of the pre-filtering filter depending on a timing or a mode of operation of the pre-filtering filter.

16. The device of claim 13, wherein the filter coefficient of the post-filtering filter is adjusted iteratively according to a least mean square (LMS) algorithm or a recursive least square (RLS) algorithm.

17. The device of claim 13, wherein the filter coefficient of the post-filtering filter is adjusted iteratively according to a least mean square (LMS) algorithm.

18. The device of claim 13, wherein the filter coefficient generation module is further configured to convert a digital control signal into an analog control signal, wherein the digital control signal contains the filter coefficient of the post-filtering filter and wherein the analog control signal contains the filter coefficient of the pre-filtering filter.

19. The device of claim 13, wherein the filter coefficient of the pre-filtering filter is different from the filter coefficient of the post-filtering filter.

20. A method for providing filtering for an analog-to-digital converter (ADC), the method comprising:
   obtaining a filter coefficient of a post-filtering filter that is located after the ADC on a signal path, wherein obtaining the filter coefficient of the post-filtering filter comprises adjusting the filter coefficient of the post-filtering filter iteratively according to a least mean square (LMS) algorithm; and
   generating a filter coefficient of a pre-filtering filter that is located before the ADC on the signal path based on the filter coefficient of the post-filtering filter, wherein generating the filter coefficient of the pre-filtering filter comprises linearly converting an amplitude of the filter coefficient of the post-filtering filter into an amplitude of the filter coefficient of the pre-filtering filter.

\* \* \* \* \*